United States Patent [19]
Chen

[11] Patent Number: 5,552,737
[45] Date of Patent: Sep. 3, 1996

[54] SCANNABLE MASTER SLAVE LATCH ACTUATED BY SINGLE PHASE CLOCK

[75] Inventor: Chih-Liang Chen, Briarcliff Manor, N.Y.

[73] Assignee: International Business Machines Corporation, Armonk, N.Y.

[21] Appl. No.: 273,554

[22] Filed: Jul. 11, 1994

[51] Int. Cl.$^6$ .......................... H03K 3/356; H03K 3/289
[52] U.S. Cl. .......................... 327/202; 327/199; 327/203; 327/211
[58] Field of Search .................................. 327/199–203, 327/208, 210, 211, 212, 214, 215

[56] References Cited

U.S. PATENT DOCUMENTS

| | | | |
|---|---|---|---|
| 4,250,406 | 2/1981 | Alaspa | 307/205 |
| 4,495,629 | 1/1985 | Zasio et al. | 327/202 |
| 4,512,029 | 4/1985 | Brice | 327/203 |
| 4,669,061 | 5/1987 | Bhavsar | 327/200 |
| 4,692,637 | 9/1987 | Shoji | 307/452 |
| 4,697,279 | 9/1987 | Baratti et al. | 327/202 |
| 4,705,965 | 10/1987 | Stuyt | 307/279 |
| 4,733,111 | 3/1988 | Fassino et al. | 307/452 |
| 4,864,544 | 9/1989 | Spak et al. | 327/203 |
| 5,003,204 | 3/1991 | Cushing et al. | 307/465 |
| 5,015,875 | 5/1991 | Giles et al. | 327/203 |
| 5,036,217 | 7/1991 | Rollins et al. | 327/200 |
| 5,072,132 | 12/1991 | Samaras et al. | 307/272.1 |
| 5,103,116 | 4/1992 | Sivilotti et al. | 307/272.1 |
| 5,105,100 | 4/1992 | Yamada | 307/279 |
| 5,130,568 | 7/1992 | Miller et al. | 327/202 |
| 5,170,074 | 12/1992 | Aoki | 327/203 |
| 5,175,447 | 12/1992 | Kawasaki et al. | 327/211 |
| 5,257,223 | 10/1993 | Dervisoglu | 327/203 |
| 5,378,934 | 1/1995 | Takahashi et al. | 327/208 |
| 5,384,493 | 1/1995 | Furuki | 327/203 |

FOREIGN PATENT DOCUMENTS

| | | |
|---|---|---|
| 3428393A1 | 2/1986 | Germany. |
| 1-171312 | 7/1989 | Japan .................................... 327/199 |
| 5-075401 | 3/1993 | Japan .................................... 327/203 |
| 6-029791 | 2/1994 | Japan .................................... 327/203 |

OTHER PUBLICATIONS

IBM Technical Disclosure Bulletin vol. 38 No. 03 Mar. 1995.
"Compact level–sensitive Scan Design Shadow latch For Transparent Latch Design Style".
IBM Technical Bulletin "Single Clock Master–Slave Latch" vol. 38, No. 03 Mar. 1995.
"Multigigahertz CMOS Dual–Modulus Prescaler IC", H. Cong et al., IEEE Journal of Solid State Circuits, vol. 23, No. 5, Oct. 1988, pp. 1189–1193.

Primary Examiner—Timothy P. Callahan
Assistant Examiner—T. Lam
Attorney, Agent, or Firm—Perman & Green

[57] ABSTRACT

A device which includes a plurality of master/slave stages, each master/slave stage includes a master segment and at least one slave segment. Each master segment (excluding the one including a first master/slave stage) may be actuated by either external logic during normal operation, or by the output of a preceding slave segment during a scan operation. A continuous single phase clock provides clocked signals to a scan port, as well as the master segment and the slave segment in each of said master/slave stages. A control portion deactivates logic applied to the master segments, and actuates logic applied from the scan port to said master segments during all scan enable periods. The control portion also deactivates the scan port from the master segment, and activates the logic output to the master segments during all normal operation periods.

2 Claims, 5 Drawing Sheets

SCANNABLE MASTER SLAVE LATCH ACTUATED BY SINGLE PHASE CLOCK

FIELD OF THE INVENTION

The present invention relates to master-slave latches in general, and more particularly to a master-slave latch formed from a master latch portion and a slave latch portion, both of which are actuated by a single phase clock. Additionally, the master-slave latch configuration permits a scanning operation without deactivating the clock and an additional scan clock.

BACKGROUND OF THE INVENTION

Figure 1:
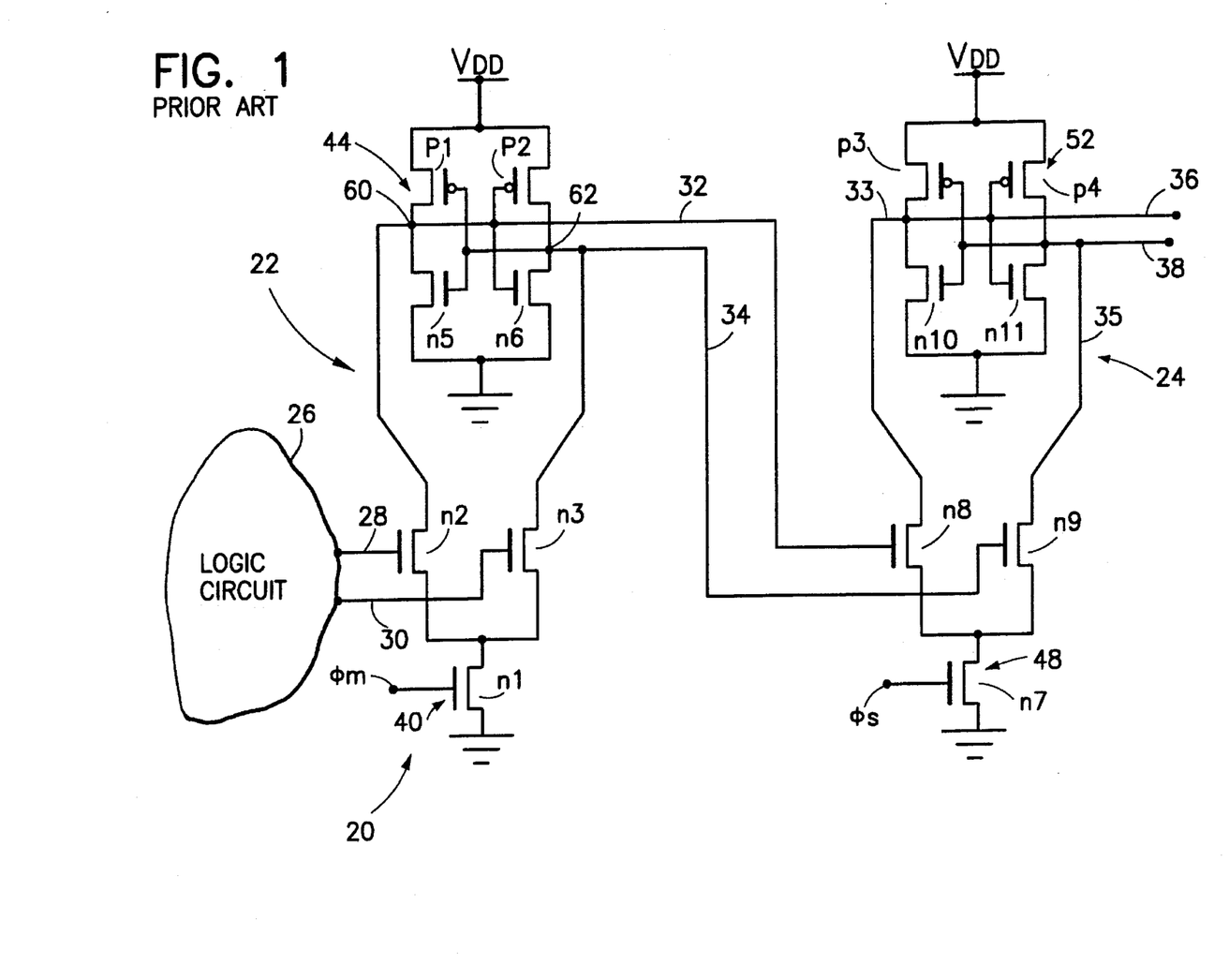
FIG. 1 is a block diagram of one embodiment of a prior art master-slave system 20.

FIG. 1 illustrates a prior art embodiment of a master-slave latch system 20. The master-slave latch system includes a master latch portion 22 and a slave latch portion 24. A logic portion 26 provides both an input 28 and a complementary input 30 (if input 28 is HIGH, then complementary input 30 is LOW, and vice versa) to the master latch portion 22. The master latch portion 22 has an output 32, and a complementary output 34, both of which are input to the slave latch portion 24 as illustrated. The slave latch portion 24 has an output 36 and a complementary output 38, both of which represent an output of the master-slave latch system 20.

The master latch portion 22 has a complementary write or clock segment 40 and cross-coupled latch segment 44. The complementary write segment contains an n-channel transistor n1 which selectively connects the remainder of the complementary write segment 40 to ground, as well as n-channel transistors n2 and n3. The cross-coupled latch segment contains n-channel transistors n5 and n6, as well as p-channel transistors p1 and p2, combined in a well known manner.

The slave latch portion 24 has a complementary write segment 48 and a cross-coupled latch segment 52. The complementary write segment contains an n-channel transistor n7 which selectively connects the remainder of the complementary write segment 48 to ground, and n-channel transistors n8 and n9. The cross-coupled latch segment 52 contains n-channel transistors n10 and n11, as well as p-channel transistors p3 and p4. The transistors in the master latch portion 22 and the slave latch portion 24 are electrically connected as illustrated in FIG. 1.

Figure 2:
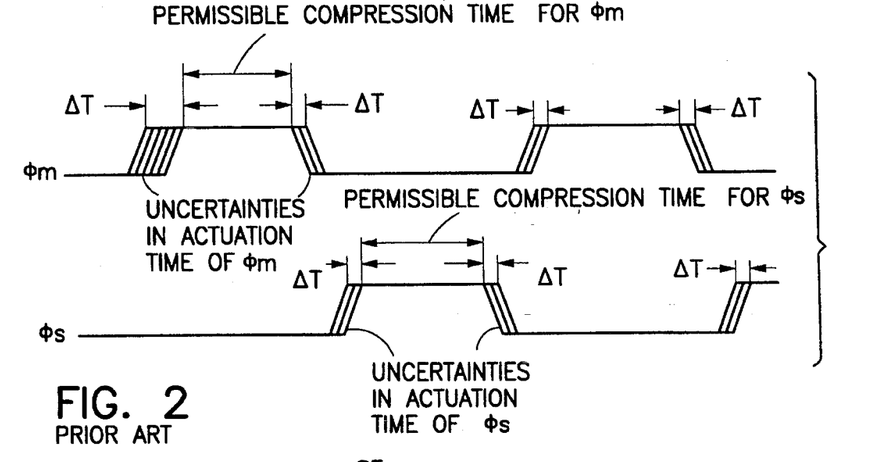
FIG. 2 is a timing diagram showing the relationship between a master clock input $\Phi_m$ and a slave clock input $\Phi_s$.

FIG. 2 illustrates a sample clock input including a master clock input $\Phi_m$ and a slave clock input $\Phi_s$. The master clock input $\Phi_m$ and the slave clock input $\Phi_s$ are input at the location referred to in FIG. 1. When the master clock input $\Phi_m$ goes high, the n-channel transistor n1 is turned on, and a high level of electric current is permitted to flow through it. Turning the n-channel transistor n1 on permits effective operation of the n-channel transistors n2 and n3, such that the values of the input 28 and the complementary input 30 can be read into the master latch portion 22, thereby enabling the master latch portion 22. Assume that initially node 60 of the master latch is at full Vdd level (node 62 will be at ground level), and a new data from logic circuits results in input 28 being at a high level (input 30 is at a low level). With master clock input $\Phi_m$ turning on, the voltage at node 60 (which is connected to output 32) starts to drop below a level equivalent to $V_{DD}-V_{(threshold)}$ then p-channel transistor p2 starts to turn on, and n-channel transistor n6 starts to turn off. Consequently, node 62 is being charged toward $V_{DD}$ level.

When the voltage at node 62 is raised to a high level as described in the prior paragraph, then the p-channel transistor p1 will be turned off and the n-channel transistor n5 will be turned on, the combination of which will tend to drive the voltage at node 60 to ground. As the process outlined in the above two paragraphs continues, then the voltage difference between nodes 60 and 62 increases until a voltage difference value of $V_{DD}$ is reached. This process will continue even after the master clock input $\Phi_m$ goes low. However, if the polarity between the input 28 and the complementary input 30 changes prior to the master clock input $\Phi_m$ going low, then the relative polarities at nodes 60 and 62 will also be reversed. After the master clock input $\Phi_m$ goes low, it can be assumed that the voltage at nodes 60 and 62 will remain in the same contention state as it was in when the clock input initially dropped. Therefore, the master latch portion 22 functions as a static latch, as does the slave latch portion 24.

For proper operation of the master-slave latch system 20 of FIG. 1, whenever the master clock input $\Phi_m$ is high (thereby enabling the master latch portion 22), the slave clock input $\Phi_s$ should be low (thereby dis-enabling the slave latch portion 24). This limits the voltages of the slave latch portion 24 affecting any of the voltages in the master latch portion 22. An operational timing sequence between the master clock input $\Phi_m$ and the slave clock input $\Phi_s$ is illustrated in FIG. 2. Only one of the two clock inputs is high at any given time.

After the master clock input $\Phi_m$ goes low, the voltage at the slave clock input $\Phi_s$ in FIG. 1 goes high. The structure of the slave latch portion 24 is identical to that of the master latch portion 22; and the operation is functions the same for each respective circuit element or portion. Using logic similar what was previously described with respect to the master latch portion, as soon as the master clock input $\Phi_m$ goes low while the voltage at the slave clock input $\Phi_s$ goes high, then the values of the output 32, and the complementary output 34, will be read directly into the slave latch portion 24 at nodes 33 and 35, respectively. The slave latch portion 24 functions as a static latch.

One disadvantage of the configuration illustrated in FIG. 2, is that in a large circuit formed from a large number of master-slave latch systems 20, the time required for a signal to travel from where the signal is produced (at an actuator—not illustrated) to any of the distinct master-slave latch systems can vary based upon a variety of factors including the distance therebetween; the material of the connection to the system; etc. This difference in time At that is required for a signal to travel from the actuator to the different master-slave latch systems 20 results in what is known as clock skew. The clock skew is undesirable because it limits the ability to precisely determine or control the time of a raising edge or a falling edge for each of the master clock input $\Phi_m$ and the slave clock input $\Phi_s$. Because of this uncertainty, the rate of clock signal reversals between the master clock input $\Phi_m$ and the slave clock input $\Phi_s$ cannot be performed as quickly as is the case if the precise time of falling edge or raising edge in both of the clocks could be precisely determined.

In a high speed microprocessor, the reliable control of clock skew and distribution becomes more stringent and difficult. The cycle time reduction due to clock skew directly decreases the useful time permitted for logic operations. The clock skew comes from the mis-match of on-chip clock buffers distributed within the chip. In conventional level sensitive scan design (hereinafter referred to as "LSSD") using master latch portions and slave latch portions as illustrated in FIG. 1, multi-phase clocks with specific phase relations are required for proper operation. The relative phase requirement, such as requiring non-overlapping clocks, further increases the complexity associated with limiting clock skew.

In the article "Multigigahertz CMOS Dual-Modulus Prescalar IC", Cong et al., IEEE Journal of Solid State Circuits, October 1988, a low-power CMOS dual modulus IC is described. A Nand gate which feeds into a single flip-flop is illustrated. Both the flip-flop and the nand gate are controlled by a single clock. There is no teaching in the Cong et al. article of utilizing a single clock to control both master and slave latches.

U.S. Pat. No. 5,036,217, which issued Jul. 30, 1991 to Rollins et al. discloses a high speed dynamic flip-flop device. Dynamic systems are intended to function relatively quickly using relatively little energy consumption. However, dynamic systems in general suffer from contention problems when left at a single state for relatively long periods. The present invention relates to static latches, in general.

Recently, high speed CMOS microprocessors have been configured with a clock speed of 200 MHz. The use of a single phase clock has the capability of greatly simplifying the distribution of the clock signal across a chip, and reduce the associated clock skew. Reducing clock skew may be accomplished by applying a single clock to both the master and slave latches, thereby eliminating uncertainty about clock timing between the master and slave latches. However, in order to be able to operate a microprocessor with a single clock phase, special latches are required for proper operation. In an LSSD design, it would be highly desirable to be able to use a single phase clock to be able to operate a master/slave latch configuration. In addition, it would be desirable to be able to test a master/slave latch configuration; which is operated by a single phase clock using a scan process.

It is desirable to be able to have a great deal of certainty about when the relative timing of the falling edge and/or the rising edge of both the master clock input $\Phi_m$ and the slave clock input $\Phi_s$ is. One technique to accomplish this is to provide a single phase clock which controls both the master clock input $\Phi_m$ and the slave clock input $\Phi_s$. It would also be highly desirable to be able to provide an efficient scanning technique for the master-slave latch system which utilizes a single phase clock.

SUMMARY OF THE INVENTION

The foregoing and other problems are overcome by a device which includes one or more master/slave stages, each master/slave stage includes a master segment and one slave segment. Each master segment may be actuated by either a logic portion during normal operation, or by the output of the preceding slave segment during scan operation. A (nonstop) single phase clock provides clock signals to a scan port, as well as the master segment and the slave segment in each of said master/slave stages. A control portion deactivates logic applied to the master segments, and actuates logic applied from the scan port to said master segments during all scan enable periods. The control portion also deactivates the scan port from the master segment, and activates the logic output to the master segments during all normal operation periods.

BRIEF DESCRIPTION OF THE DRAWINGS

The above set forth and other features of the invention are made more apparent in the ensuing Detailed Description of the Invention when read in conjunction with the attached Drawings, wherein:

FIGS. 4a–4c is a timing diagram of one embodiment of the desired relative timing of the present invention master-slave system of the present invention as applied to FIG. 5, wherein FIG. 4a illustrates a standard clock input; FIG. 4b illustrates the state of a scan-enable complement node; and FIG. 4c illustrates the voltage levels applied to the gates of transistors n68' and n69' of FIG. 5;

DETAILED DESCRIPTION OF THE INVENTION

In this Disclosure, elements which perform similar functions in the different embodiment may be provided with the same reference characters. It is preferred that CMOS technology be utilized in the present invention. However, non-CMOS technology may also be applied and will be within the scope of the present invention.

Master-Slave Configuration

Figure 3:
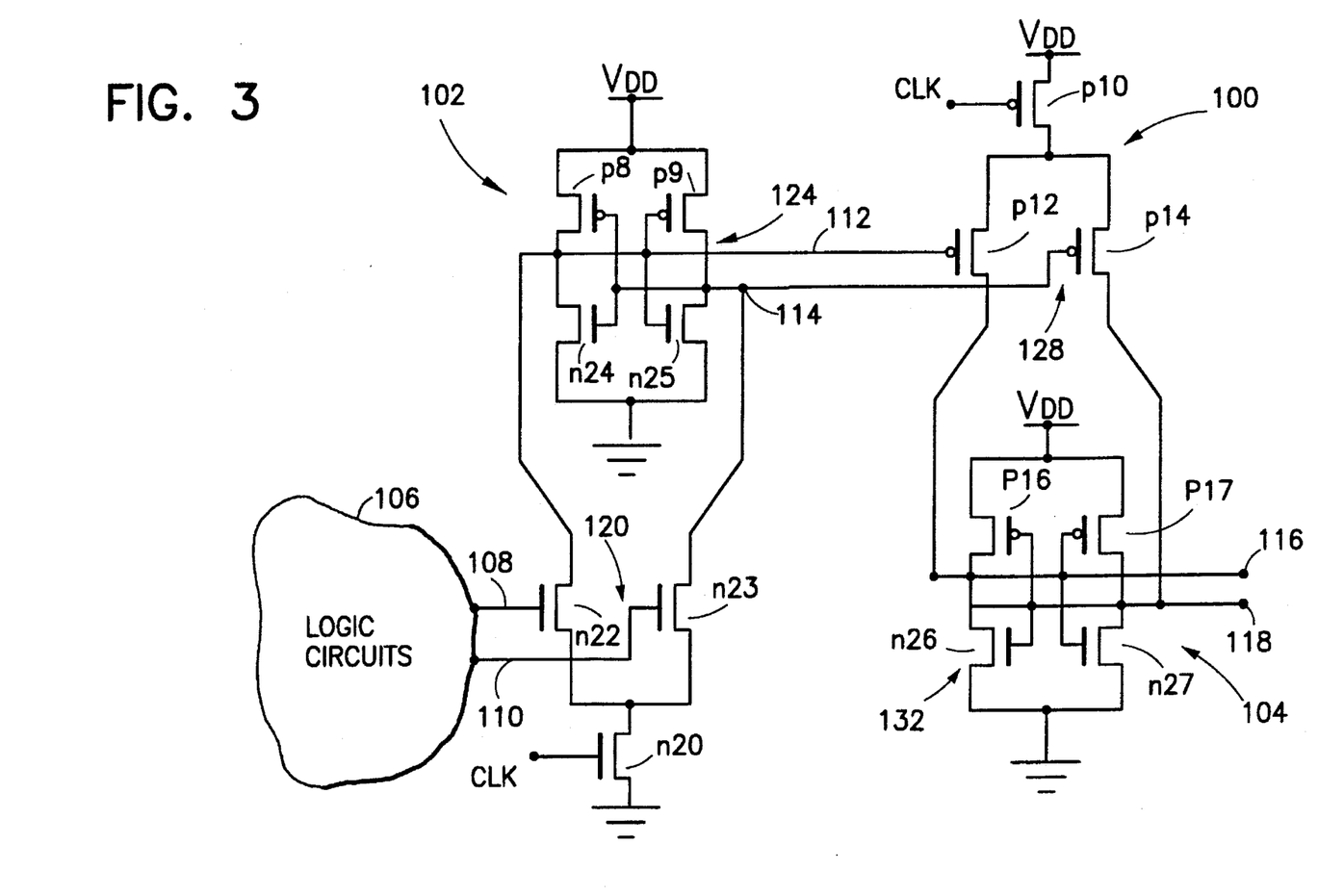
FIG. 3 is a block diagram of one embodiment of the master-slave system of the present invention.

FIG. 3 illustrates one embodiment of master-slave latch system 100 of the present invention. The master-slave latch system 100 includes a master latch portion 102 and a slave latch portion 104. A logic portion 106 provides signals to an input 108 and a complement input 110; both of which are electrically connected to the master latch portion 102 as illustrated. The master latch portion 102 has an output 112 and a complementary output 114, both of which are input to the slave latch portion 104 as illustrated. The slave latch portion 104 has an output 116 and a complementary output 118, which represent the system outputs of the master-slave latch system 100.

The master latch portion 102 has an n-channel complementary write or clock segment 120 and a cross-coupled latch segment 124. The n-channel complementary write or clock segment 120 contains an n-channel transistor n20 which selectively connects the rest of the complementary write segment 120 to ground, including n-channel transistors n22 and n23. The cross-coupled latch segment contains n-channel transistors n24 and n25, as well as p-channel transistors p8 and p9.

The slave latch portion 104 has a p-channel complementary write or clock segment 128 and a cross coupled latch segment 132. The complementary write segment contains a p-channel transistor p10 which selectively connects the remainder of the complementary write segment 128 to $V_{DD}$, as well as p-channel transistors p12 and p14. The cross-coupled latch segment 132 contains p-channel transistors p16 and p17, as well as n-channel transistors n25 and n27. The transistors in the master latch portion 102 and the slave latch portion 104 are electrically connected as illustrated in FIG. 3. While the slave latch portion 24 in the FIG. 1 prior art configuration may be viewed as a copy of the master latch portion 102; in FIG. 3, the associated n-channel and p-channel transistors in the complementary write segments of the master latch portion 102 are inverted in the slave latch portion 104. This disclosure provides a description of the FIG. 3 embodiment structure and operation.

The operation of the master latch portion 102 in FIG. 3 is identical to the operation of the master latch portion 22 in FIG. 1, except that the input of the master clock input $\Phi_m$ of FIG. 1 is replaced by a clock input CLK. Each of the corresponding components in the master latch portion functions identically between FIG. 1 and FIG. 3, such that the master latch portion 102 reads the values of the input 108 and the complementary input 110 into the respective values of the output 114 and the complementary output 112 whenever the value of the clock input CLK is high. When the value of the clock input CLK is high, the p-channel transistor p10 is off which disconnects the slave latch portion 104 from $V_{DD}$, thereby disassociating the slave latch portion 104 from the master latch portion 102.

Whenever the clock input CLK is low, the master latch portion 102 becomes disassociated with input 108 and complementary input 110 when the n-channel transistor n20 is turned off. Therefore, whatever value the input 108 and the complementary input 110 become after the clock input progresses through a falling edge, the relative polarities of the output 112 and the complementary output 114 remain as just prior to the falling edge of the clock input CLK. When the clock input CLK goes low, however, the slave latch portion 104 becomes active and is able to latch the values from outputs 112 and 114 of the master latch portion 102 into respective outputs 116, 118 of the slave latch portion 104. Note that even though the slave latch portion 104 of FIG. 3 initially appears to have a similar configuration as the slave latch portion 24 of FIG. 1, each component (p-channel transistor or n-channel transistor) of the respective complementary write segments are reversed between the two configurations. Since the same CLK signal is applied to both the master latch portion and the slave latch portion in FIG. 3, this embodiment does not suffer from the $\Delta T$ uncertainty which is illustrated in FIG. 2 which occurs with the FIG. 1 embodiment. The FIG. 3 embodiment (as well as the FIG. 6 embodiment) illustrates a static master-slave latch system.

The operation of the slave latch portion 104 of FIG. 3 is as follows. When the output 112 and the complementary output 114 (which are actually connected to the inputs of the slave latch portion) are input to the slave latch portion 104 and the clock input CLK is low, then $V_{DD}$ is applied to the sources of p-channel transistors p12 and p14. Assuming that the output 112 is high and the complementary output 114 is low (the reverse polarities would produced a reversed analysis), then p-channel transistor p14 is turned on and p-channel transistor p12 is turned off. Turning p-channel transistor p14 on tends to turn p-channel transistor p16 off and n-channel transistor n25 on. Also, turning p-channel transistor p12 off tends to turn p-channel transistor p17 on and n-channel transistor n27 off. This configuration of n-channel transistors and p-channel transistors being on and off tends to raise the voltage at the output 118 to $V_{DD}$ (since p-channel transistors p17, p10, and p14 are on and n-channel transistor n27 is off); and will also tend to reduce the voltage at the complementary output 116 to ground (since the p-channel transistors p12 and p16 are both off, and the n-channel transistor n25 is on.)

The above transitions may not occur instantaneously, but as the voltage difference between the output 116 and the complementary output 118 of the slave latch portion 104 become more polarized in one direction, the polarization will tend to increase due to the above described states of the n-channel and p-channel transistors. Circuit simulation shows no feed-through of data (where the present logic value applied to the master is fed through to the slave when the master is deactivated by the clock input being low) from the master latch portion 102 to the slave latch portion 104, when the transition time is set at 200 psec. The relative device sizes of n22 to p8; n23 to p9; p12 to n25; and p14 to n27 are selected to ensure overwriting of the latches as described below. The device size ratios can be determined in a manner similar to that employed for sizing a write circuit for a static RAM, as described below.

Scan Operation

Typically, there are a plurality of master-slave systems 100 such as illustrated in FIG. 3, with one master-slave system being used for each bit of logic. The multiple master-slave systems are arranged in parallel. In order to test whether each of the master-slave systems 100 is properly functioning, a scan process is utilized such that the output of the slave latch portion of a first master-slave system is input into the master latch portion of a second master-slave system (and the output of the second is fed into the input of the third, etc.) During scan operations, a series of known inputs are applied to the master latch portion of the first master-slave system. The outputs of each of the master-slave systems are monitored, through a variety of inputs to the first master-slave system, to determine whether the outputs are at the desired values based upon the inputs. If one or more of the outputs are at a non-desired value, it is relatively simple to determine which of the master-slave systems 100 is functioning improperly. The scanning technique becomes especially important when there are large numbers of master-slave systems to test.

Figure 5A:
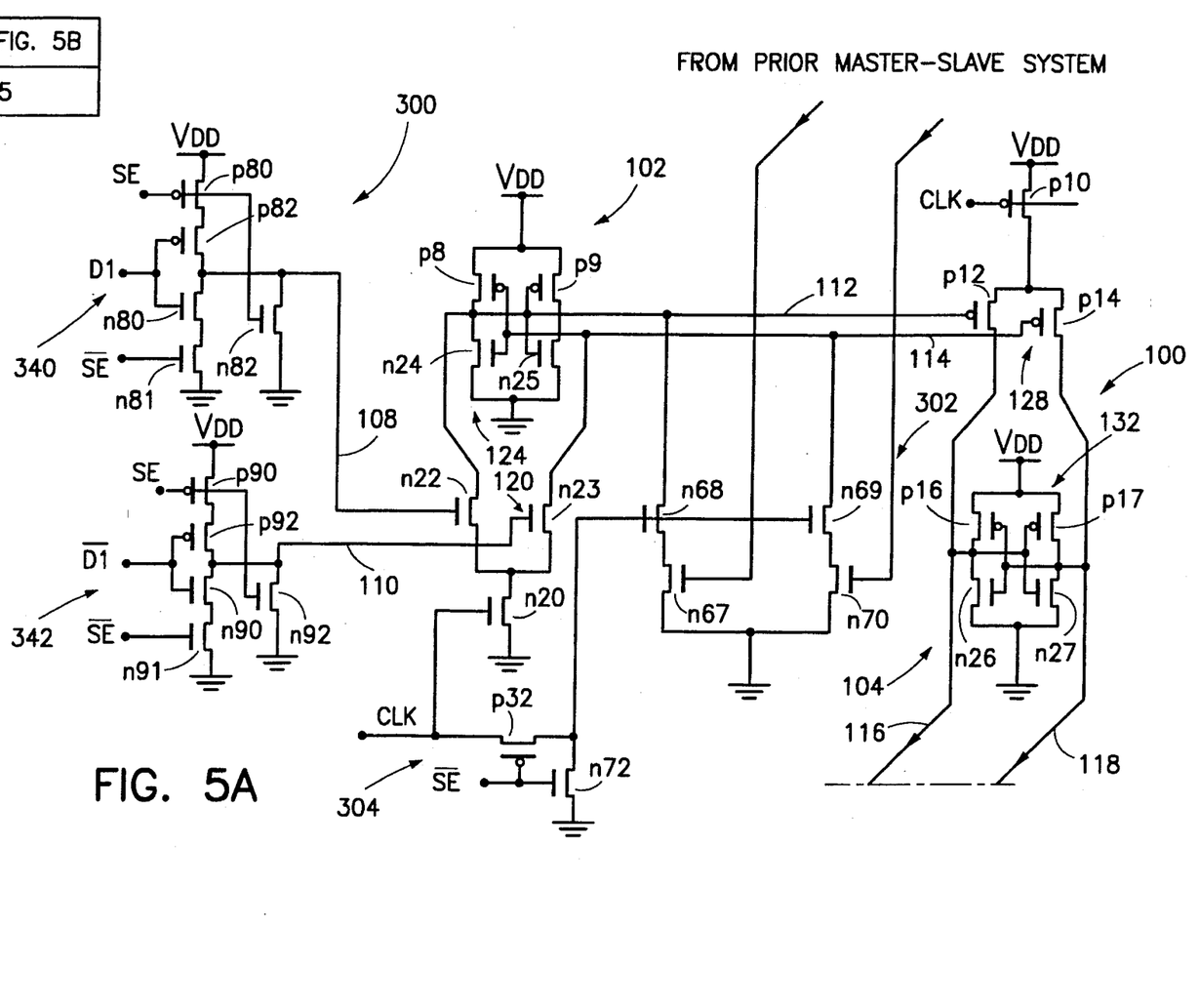
FIG. 5 is a block diagram of one embodiment of a combined plurality of master-slave systems, which are configured in such a manner as to permit scanning.
Figure 5B:
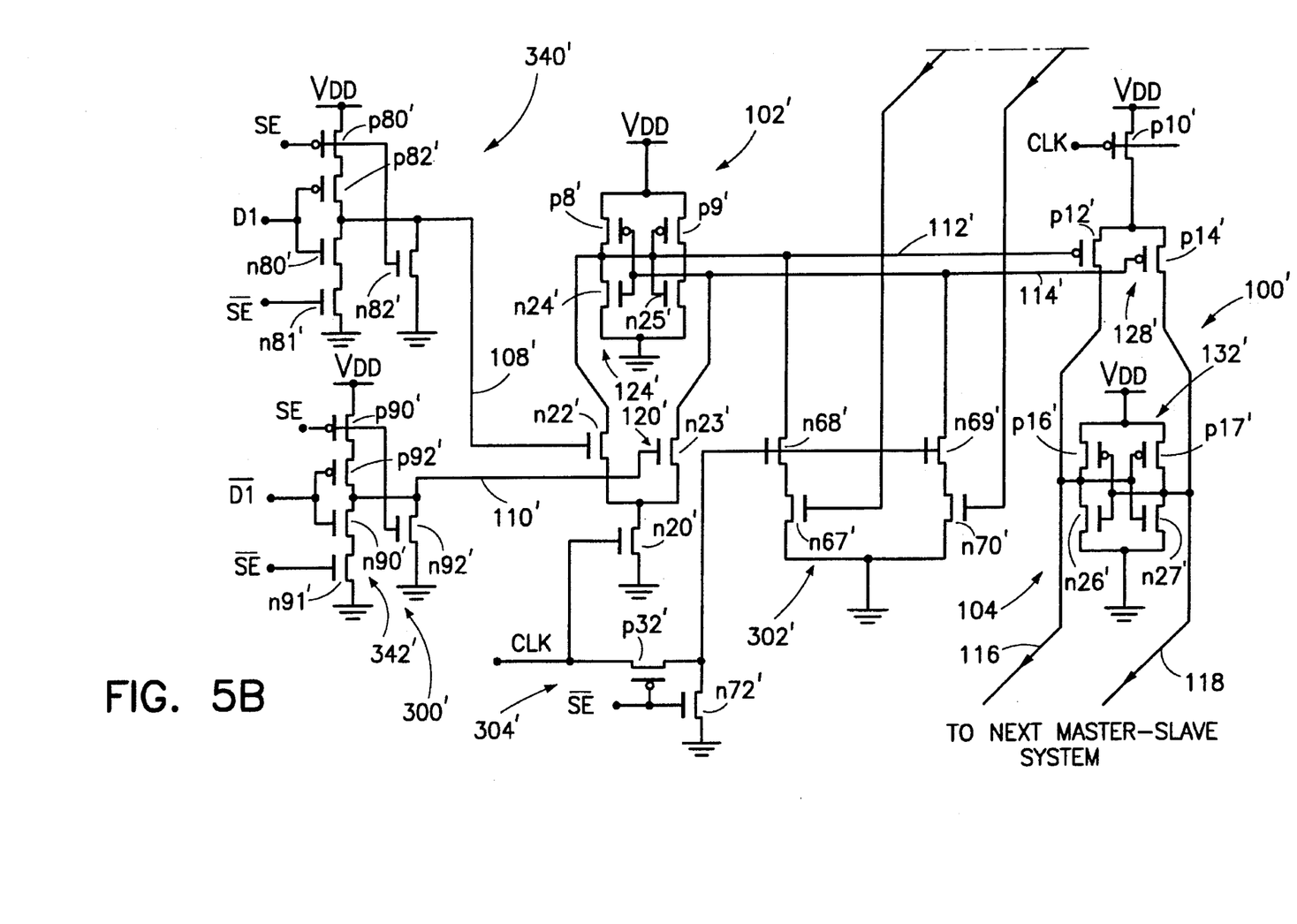

FIG. 5 illustrates two of the identical circuits as the master-slave system illustrated in FIG. 3, plus additional elements which are used for scanning. For this reason, each of the reference characters in the first master-slave system 100 of FIG. 5 (which is structurally similar to the master-slave system of FIG. 3) will be provided with the same reference characters as used in FIG. 3. The reference characters of the second master-slave system 100' will be provided with a primed sign ('). There are several elements in the first master-slave system 100 and the second master-slave system 100' which are not contained in FIG. 3. The remaining portion of this disclosure will refer to the operation of the additional elements in FIG. 5 (which will be provided with reference characters numbered from 300–399), and how these new elements relate to the operation of the first master-slave system 100 and the second master-slave system 100'.

The new elements of the FIG. 5 embodiment include scan override segments 300, 300'; scan input ports 302, 302'; and scan clock inputs 304, 304'. The function of the scan override segments 300, 300' is to cause each of the master-slave systems 100, 100' to operate in the normal parallel-latch manner, as described above with reference to FIG. 3, when a scan enable node SE is low (resulting in a high output for the scan enable complement node $\overline{SE}$); and to cause the master-latch systems to operate in the scan mode when the scan enable node SE is high (resulting in a low output from the scan enable complement node $\overline{SE}$). The function of the scan input ports 302, 302' is to provide an electrical connection whereby the value of the output 116 (and complementary output 118) of the slave latch portion 104 of the preceding master-slave system 100 is input into the master latch portion 102' of the master-slave system 100'

(instead of the input 108' and the complementary input 110' being input into the master latch portion 102') whenever the scan enable node SE is high.

In the FIG. 5 embodiment, the respective inputs 108,108', and complementary inputs 110, 110' which are applied to the first master-slave system 100 and the second master slave system, respectively, results in the values which are being input into the master latch portions 102, 102' being transferred through the slave latch portions 104, 104' using the above described process (and values of the clock CLK) when the values of a scan enable node SE is low (and the value of the scan enable complement node $\overline{SE}$ is high).

In FIG. 5, the scan input port 302 includes n-channel transistors n67, n68, n69 and n70; while the scan input port 302' includes n-channel transistors n67', n68' n69' and n70' (the remaining discussion with reference to FIG. 5 will refer to the master-slave system 100', with the assumption that a similar corresponding configuration is utilized in the master-slave system 100). The n-channel transistor n67' is controlled by the output 116 of the slave latch portion 104, while the n-channel transistor n70' is controlled by the complementary output 118 of the slave latch portion 104. The n-channel transistor n68' is located between the n-channel transistor n67' and the output 112' of the master latch portion 102'. The n-channel transistor n69' is located between the n-channel transistor n70'0 and the complementary output 114' of the master latch portion 102'. The scan clock input 304' includes a n-channel transistor n72' and a p-channel transistor p32'. When the scan enable complement node $\overline{SE}$ is not enabled (the scan enable node SE is enabled), the clock CLK signal is applied directly to the gates of n-channel transistors n68' and n69' and the voltage values of the output 116 and complementary output 118 will be read as the input to the master latch portion 102'. During this period, the inputs to the master latch portion 102' will be deactivated (by the scan override segment 300') in the manner described below.

Figure 6:
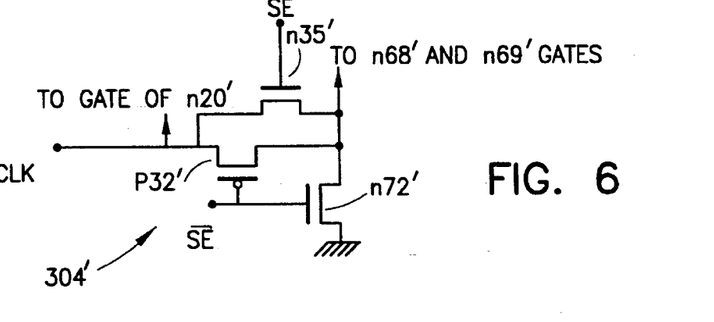
FIG. 6 illustrates an alternate embodiment of a scan clock input 304' from that illustrated in FIG. 5.

FIG. 6 illustrates an alternate embodiment of the scan clock input 304' of FIG. 5. The only difference between the FIG. 5 scan clock input 304'0 and the FIG. 6 scan clock input is the addition of n-channel transistor n35' which is enabled when the scan-enable node is high. This provides an additional device capable of supplying current to actuate the n-channel transistors n68' and n69' when in the scan-enable mode of operation.

When the scan enable complement node $\overline{SE}$ is enabled (the scan enable node SE is not enabled), then the p-channel transistor p32' is deactivated, and the n-channel transistor n72' is activated. This combination will cause the gates of the n-channel transistors n68' and n69' to be grounded, and thereby deactivated. Turning off these two transistors will limit any effect that the state of the n-channel transistors n67' and n70' can have on the master latch portion 102', i.e. it will disable the scan input port 302'.

The scan override segment 300' of FIG. 5 contains an input scan/normal segment 340' and an input complement scan/normal segment 342'. The input scan/normal segment applies the complement logic value of node DI to the input 108' of the master latch portion 102' during normal operation; and disconnects the node DI from the input 108' of the master latch portion 102' during scan operations. The input scan/normal segment 340' contains p-channel transistors p80' and p82' as well as n-channel transistors n80', n81', and n82'. When the scan enable node SE is high, the p-channel transistor p80' and the n-channel transistor n81' are off, and n-channel transistor n82' is on. $V_{DD}$ is thereby disconnected from the input 108' under all circumstances, limiting the application of any voltage to the input 108'. In addition, the n-channel transistor n82' will be on, grounding the input 108'.

When the scan enable complement $\overline{SE}$ is actuated, both the p-channel transistor p80' and the n-channel transistor n81' are on, and the n-channel transistor n82' is off, thereby permitting the p-channel transistor p82' and the n-channel transistor n80' to control the application of voltage to input 108'. The voltage at node DI becomes the complement voltage level to the voltage which is applied to the input 108 of the master latch portion 102 of the FIG. 3 embodiment during normal operation. When the voltage at node DI' is high, the p-channel transistor p82' is off while the n-channel transistor n80' is on; resulting in input 108' being grounded. When the voltage at node DI' is low, p-channel transistor p82' is on and the n-channel transistor n80' is off. This results in $V_{DD}$ being applied to input 108' through the p-channel transistor p82' and the generation of a high logic level at input 108'.

The transistors of the input complement scan/normal segment 342' operates in a similar manner as the transistors of the input scan/normal segment 340' described in the prior paragraph, by applying the complement of the logic value of node $\overline{DI}$' to the input complement 110' of the master latch portion 102' during normal operation, and disconnecting the value of node $\overline{DI}$ from the input 110' complement of the master latch portion 102' during scan operations. The input complement scan/normal segment 342' contains p-channel transistors p90' and p92' as well as n-channel transistors n90', n91', and n92' When the scan enable node SE is high, the p-channel transistor p90' and the n-channel transistor n91' are off, and $V_{DD}$ is disconnected from the input complement 110' under all circumstances; thereby disabling the input complement scan/normal segment 342'. In addition, the n-channel transistor n92' is on, grounding the voltage at the input complement 110'.

When the scan enable complement $\overline{SE}$ is actuated (the scan enable SE is de-activated), both p-channel transistor p90' and n-channel transistor n91' are on, and n-channel transistor n92' is off; thereby permitting the p-channel transistor p92' and the n-channel transistor n90' to control the application of voltage to input complement 110'. The voltage at node $\overline{DI}$' becomes the complementary voltage ($V_{DD}$) to that applied to the input complement 110 of the master latch portion 102 of the FIG. 3 embodiment during normal operation. When the voltage at node $\overline{DI}$ is high, the p-channel transistor p92' is off while the n-channel transistor n90' is on. This results in the input complement 110' being grounded. When the voltage at node $\overline{DI}$' is low, p-channel transistor p92' is on and the n-channel transistor n90' is off. This results in $V_{DD}$ being applied to input complement 110' through the p-channel transistors p92' and p90' and a generation of a high signal level at input complement 110'.

Both the input scan/normal segment 340' and the input complement scan/normal segment 342' may be considered as a device functioning in tri-state (high impedance), as will be recognized by one having ordinary skill in the art. Any suitable tri-state configuration may be utilized in place of segments 340' and 342' while remaining within the intended scope of the present invention. The selection of the specific circuit configurations in FIGS. 3 and 5 is intended to be largely a matter of design choice.

Figure 4A:
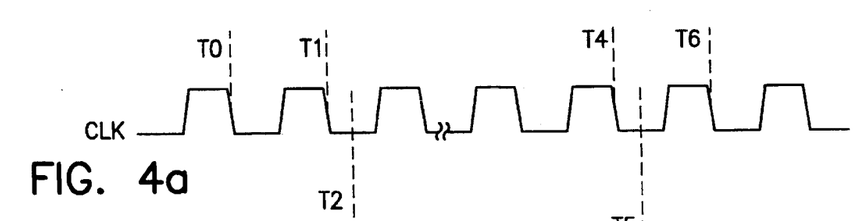
Figure 4B:
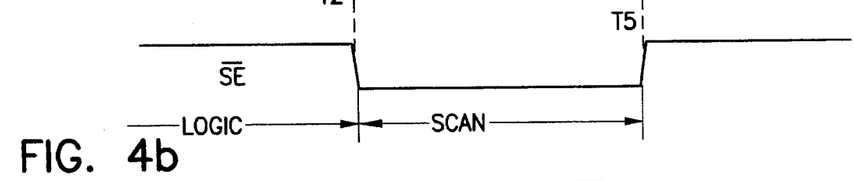
Figure 4C:
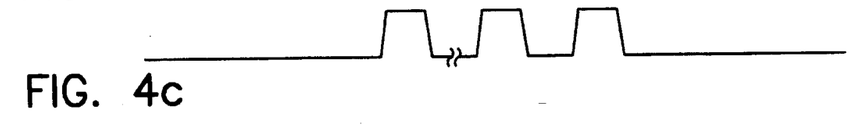

FIGS. 4a–4c illustrate a sample clock CLK input in the FIG. 5 embodiment of the present invention, and how energizing the scan enable node SE limits the application of the clock input (as well as the logic associated with the DI and $\overline{DI}$ nodes). FIG. 4a illustrates a continuous clock CLK signal. FIG. 4b illustrates the values of the scan-enable complement. FIG. 4c illustrates the value of the clock input as applied to the gates of transistors n68' and n69' of FIG. 5. Note that when the scan enable node is inactive (and the scan enable complement node $\overline{SE}$ is active) all clock values are disconnected from the gates of transistors n68' and n69'. Otherwise, the logic value of the clock CLK will be applied directly to the gates of transistors n68' and n69'. In the prior art scan configurations, the clock input itself must be disabled when the master/slave system enters the scan mode. In the FIG. 5 embodiment of this invention, the effects of the output of the clock CLK upon the master/slave system 100 are limited such that the clock CLK is not required to be turned off during the scan mode. Not only does turning off the clock in the prior art configurations require added circuitry, but it also produces extraneous electromagnetic radiative signals which can effect operation of, and electronic signals located in, other sensitive portions of the circuit. Since the clock is permitted to continually run in the present invention, such electromagnetic radiative signals are not produced.

The use of the single phase clock as described herein furthermore beneficially limits the timing uncertainties resulting from clock skew, as described previously with respect to the prior art.

Device Size

In order to provide proper operation of the FIG. 3 circuit, it is important that certain of the devices (transistors) be sized with respect to other devices in order to ensure proper operation of the entire circuit. There are some basic premises which should be followed when sizing such devices. By example:

1. A p-channel transistor which is the same size as an n-channel transistor can conduct only half of the current. Therefore, if it is desired to design a circuit with similar characteristics between the n-channel and the p-channel devices, then it is important to design the p-channel device to be twice the size of the n-channel device.

2. For writing a "zero" (ground level) into the master latch, the equivalent n-channel pull-down strength (n22 and n20 in series) is chosen to be equal or greater than that of the hold-up p-channel device p8. Thus, the switching node 112 in FIG. 5 can be quickly discharged to a level of (½ $V_{DD}$), once the clock input activates n-channel write circuit. The ½ $V_{DD}$ bias will initiate a self-regenerating process in the cross-coupled master latch, and can reliably discharge the switching node 112 toward ground level.

Similarly, for writing a "one" into the slave latch, the equivalent p-channel pull-up strength (p10 and p12 in series) is also chosen to be about the same strength as that of the hold-down n-channel device n26. Thus, the switching node 116 in FIG. 5 can be quickly charged to ½ $V_{DD}$ level, once the clock input activates the p-channel write circuit. Then, a self-regenerating action of the slave latch will pull-up node 116 to a Vdd level.

An example of a circuit device size design which satisfies the above design requirements follows. It is assumed that each of the dimensions are taken in μm, and all devices have the same channel length of 0.25 μm. Those transistors which are designed at 5 μm in FIG. 5 are n26 and n27. Those transistors which are sized to be 10 μm are n80, n81, n90, n91 n24, n25, n22, n23, n67, n68, n69, n70, n20, n82, n92, p8, p9, p16, and p17. Those transistors which are sized to be 20 μm are n72, p80, p82, p90, p92, p10, p12, p14 and p32. While the above provides one potential size configuration for the transistors, it is also possible to have other relative size configurations which fall within the above design criterion. If it is desired to have a different sized circuit, the above sizes can be scaled appropriately.

While the invention has been particularly shown and described with respect to a preferred embodiment thereof, it will be understood by those skilled in the art that changes in form and details may be made therein without departing from the scope and spirit of the invention.

What is claimed is:

1. A static master/slave circuit system comprising:

a plurality of successive static master/slave stages, each master/slave stage including a master segment and at least one slave segment, each master segment may be actuated by a signal from external logic in a first mode of operation, or by output signals from a preceding slave segment applied to said master segment during a second mode of operation;

a scan port circuit connected between the slave stage of one master/slave and the master stage of the next successive master/slave stage, said scan port circuits including a plurality of n-channel transistors connected to a scan clock input means including an n-channel transistor and a p-channel transistor;

a continuous single phase clock signal which provides clocked signals to the scan port circuit, as well as to the master segment and the slave segment in each of said master/slave stages; and control means for deactivating said signal from external logic applied to said each master segments in said first mode of operation, and activating said signals from the preceding slave segment applied to said master segment when in said second mode; said control means further deactivating said scan port circuit from said master segment, and activating said signal from external logic to said master segment, when in said first mode of operation.

2. The circuit arrangement as described in claim 1, further comprising:

clock limiting means for limiting the application of the clock signal to the scan port circuit during periods when said master segment is the second mode of operation.

* * * * *